United States Patent [19]
Sobhani

[11] Patent Number: 5,743,747
[45] Date of Patent: Apr. 28, 1998

[54] DIMPLED CONNECTOR

[75] Inventor: Mohi Sobhani, Encino, Calif.

[73] Assignee: Hughes Electronics, Los Angeles, Calif.

[21] Appl. No.: 783,840

[22] Filed: Jan. 13, 1997

[51] Int. Cl.$^6$ ........................................ H01R 9/09
[52] U.S. Cl. .................................. 439/67; 439/492
[58] Field of Search ........................ 439/67, 77, 329, 439/492, 493, 499

[56] References Cited

U.S. PATENT DOCUMENTS 5,213,511  5/1993  Sobhani ............................. 439/67

*Primary Examiner*—Gary F. Paumen
*Assistant Examiner*—T. C. Patel
*Attorney, Agent, or Firm*—Leonard A. Alkov; William C. Schubert; Glenn H. Lenzen, Jr.

[57] ABSTRACT

A connector having a pair of structural substrates that each contain mechanically raised dimples and adjacent mating flexible interconnect circuits. The structural substrate has one or more structural dimples formed therein that protrude above one surface. A metallization pattern on the substrate overlays each of the structural dimples to provide additional structural support. The flexible interconnect circuits each comprise a dielectric substrate fabricated as a flat flexible circuit having conductive traces formed on top and bottom sides thereof, respectively, that terminate in contact areas. The conductive traces are configured to conform to the shapes of the respective dimples of the structural substrates when they are mated. The mated flexible interconnect circuits are compressed by the structural substrates using plates or other securing members so that contact therebetween is made by the conductive traces adjacent the contact areas. The contact areas of the flexible interconnect circuits conform to and mate with the structural dimples without the need to form dimples in the flexible interconnect circuits.

5 Claims, 2 Drawing Sheets

5,743,747

DIMPLED CONNECTOR

BACKGROUND

The present invention relates generally to rotary connectors, and more particularly, to a connector employing a dimpled structural circuit and a flexible interconnect circuit.

Conventional connectors employ the use of cable-wrap connectors, slip rings, roll rings, brushes and motors, and telephone wire coils. The disadvantages of conventional connector designs are as follows. Cable-wrap connectors have low reliability. Slip rings have low reliability and have an unworkable geometry. Roll rings are costly and have an unworkable geometry. Brush and motor designs are not applicable to the design of rotary connectors, and are expensive. Similarly, telephone wire coils are bulky, and are not generally applicable to the design of connectors.

To overcome the limitations of these conventional connectors, the assignee of the present invention has developed a dimpled connector that provides a reliable and low cost alternative to conventional connectors. Such dimpled connectors are disclosed in U.S. Pat. No. 5,213,511 entitled "Dimple Interconnect for Flat Cables and Printed Wiring Boards", which patent is assigned to the assignee of the present invention. The contents of U.S. Pat. No. 5,213,511 is incorporated herein by reference in its entirety.

The invention of U.S. Pat. No. 5,213,511 provides for a connector that has dimples on flexprint circuit that are pressed against dimples on a similar flexprint or circuit or printed wiring board. The respective dimples are held together by means of a plate or other securing member. Thus, in the connector of U.S. Pat. No. 5,213,511 dimples are formed in both the mating circuits. The present invention provides for an improvement to the dimpled connector disclosed in this patent and which eliminates the need to form dimples on both circuits.

Accordingly, it is an objective of the present invention to provide for a connector employing a dimpled structural circuit and an adjacent mating flexible interconnect circuit.

SUMMARY OF THE INVENTION

To meet the above and other objectives, the present invention provides for a dimpled connector having pairs of structural substrates and flexible interconnect circuits that overlay and conform to each other. The structural substrates have one or more mechanically raised structural bumps or dimples formed therein that protrude above one surface thereof. Metallization is formed on the substrates that overlay each of the structural dimples to provide support at the location of each of the structural dimples.

A first flexible interconnect circuit is fabricated with conductive metallization or traces formed on a top side thereof. A second flexible interconnect circuit is fabricated with conductive traces formed on a bottom side thereof. The traces are used to route electrical signals to and from a fully fabricated connector. However, the flexible interconnect circuits are not constructed to have dimples formed therein, but are configured to conform to corresponding ones of the structural dimples of the structural substrate. Thus, the flexible interconnect circuits may be fabricated as flat flexible circuits that have metallization patterns that conform to the structural dimples, without the need to form dimples in the flexible interconnect circuit. Contact areas of the respective flexible interconnect circuits mate with each other when compressed together by the structural substrates and the conductive traces make electrical contact with each other. Certain of the conductive traces may also be interconnected to a portion of the metallization formed on the structural substrate, which forms a ground plane, for example, by means of vias through the flexible interconnect circuit.

The metallization patterns that form the contacts on the flexible interconnect circuits may have a variety of different configurations, such as a pattern that produces dome shape contacts that match the shape of the conductive dimples when mated. The configuration may be a pattern that produces dome shaped contacts with cutouts that flex relative to the conductive dimples when the circuits are mated. The configuration may be a pattern that produces dome shaped contacts that are truncated and that flex relative to the conductive dimples when mated. The configuration may also be a pattern that produces cylindrical shaped contacts that are truncated to form relatively thin dimples that flex relative to the conductive dimples when mated. The contacts of the flexible interconnect circuit overlay and mate with the underlying contacts formed on the structural dimples of the structural substrate. The flexible nature of the contacts of the flexible interconnect readily permits contact with the contacts formed on the structural dimples notwithstanding partial misalignment thereof.

In order to form a fully functional connector, the second flexible interconnect circuit is disposed adjacent a bottom side of a second structural substrate and is supported thereby. The second structural substrate has supporting metallization disposed on the dimples in the same manner as the first structural substrate. The first and second flexible interconnect circuits are made to contact each in a male-female configuration. The conductive traces on the adjacent flexible interconnect circuits make electrical contact with each other. As in the connector disclosed in U.S. Pat. No. 5,213,511, in the present dimpled connector, the contact areas of on the adjacent flexible interconnect circuits may be compressed together by means of plates or other securing members.

The metallization on the structural dimples may be constructed using materials such as beryllium copper, for example, which provides for support at the location of the dimples and allows spring fluctuation during the operation of dimpled connector. Such spring fluctuation also compensates for potential warpage of the structural substrate. The dimpled connector makes electrical interconnection possible without the use of a connector or soldered wire. The dimpled connector may be readily used in high density and low profile connector applications.

The dimpled connector may be used to replace unreliable cable-wrap connectors, for example. Advantages of the dimpled connector include lower cost, smaller size, higher reliability, and less volume than conventional cable-wrap connectors, for example. Furthermore, the dimpled connector may be easily replaced in the field for those systems that are found to have defective connectors, without requiring return of the systems to the factory or to a repair depot. The dimpled connector may be used in military, commercial and industrial applications, such as on military aircraft and avionics, automotive products and display products, for example.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1:
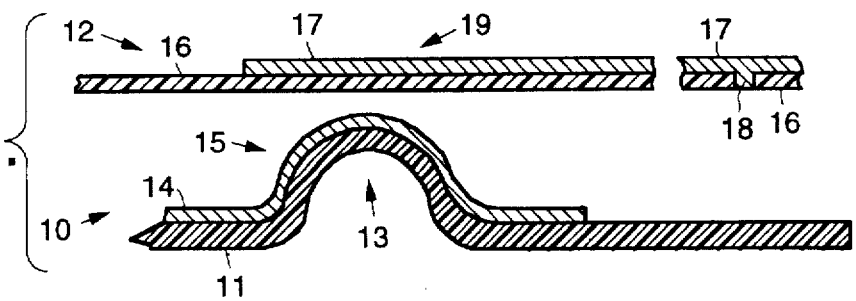
FIG. 1 shows a cross sectional view of a portion of a dimpled connector in accordance with the principles of the present invention prior to mating of its circuits.

Referring to the drawing figures, FIG. 1 shows a cross sectional view of a portion of a dimpled connector 10 in accordance with the principles of the present invention prior to mating of its circuits. The dimpled connector 10 comprises a structural substrate 11 and an adjacent mating flexible interconnect circuit 12. The structural substrate 11 has one or more mechanically raised structural bumps 13 or dimples 13 formed therein that protrude above one surface thereof. A metallization pattern 14 is formed on the structural substrate 11 which overlays each of the structural dimples 13.

The metallization pattern 14 formed on the structural dimples 13 of the structural substrate 11 may be made using materials such as beryllium copper, for example. The use of this type of metal allows spring fluctuation during the operation of the dimpled connector 10. Such spring fluctuation compensates for potential warpage of the structural substrate 11.

The flexible interconnect circuit 12 comprises a dielectric substrate 16 that is fabricated to have conductive metallization 17 or traces 17 formed on one sides thereof which terminate in contact areas 19. The conductive traces 17 may be interconnected to a portion of the metallization 14 on the structural substrate 11, which provides a ground plane, for example, by means of vias 18 through the dielectric substrate 16 of the flexible interconnect circuit 12. The conductive traces 17 on the dielectric substrate 16 are configured so that they can mate with the mechanically raised bumps 13 or dimples 13 formed on the structural substrate 11 when they are pressed together.

The flexible interconnect circuit 12 is not constructed to have dimples formed therein. The contact areas 19 formed by the metallization 17 is configured to mate with corresponding ones of the structural dimples 13 of the structural substrate 11. Thus, the flexible interconnect circuit 12 may be fabricated as a flat flexible circuit 12 having conductive traces 17 and contact areas 19 that conform to and mate with the structural dimples 13, without the need to form dimples in the flexible interconnect circuit 12.

Figure 2:
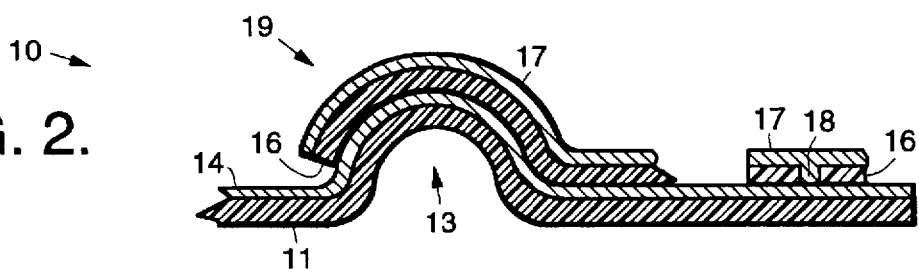
FIG. 2 shows a cross sectional view of a portion of the present dimpled connector after mating of its flexible interconnect circuit and structural substrate.

FIG. 2 shows a cross sectional view of a portion of the dimpled connector 10 after mating of the flexible interconnect circuit 12 and the structural substrate 11. The contact areas 19 of the conductive traces 17 are designed to conform to the shape of the structural dimples 13 of the substrate 11. The flexible interconnect circuit 12 when pressed down upon the substrate 11 causes the contact areas 19 to conform to the shape of the structural dimples 13, thus providing raised contact areas 19.

A fully functional connector 10 comprises first and second flexible interconnect circuits 12 supported by separate first and second structural substrates 11. The flexible interconnect circuits 12 have their respective conductive traces 17 and contact areas 19 disposed adjacent to each other and are supported by their respective substrates 11. The substrates 11 are pressed together so that the conductive traces 17 adjacent the contact areas 19 make contact with each other. The contact areas 19 may be held together by means of plates 20 or other securing members 20 (FIG. 3) such as in the manner disclosed in U.S. Pat. No. 5,213,511. The flexible nature of the dimples 13 and flexible interconnect circuit 12 readily permits contact between the contact areas 19 notwithstanding partial misalignment of the substrates 11 or dimples 13.

Figure 3:
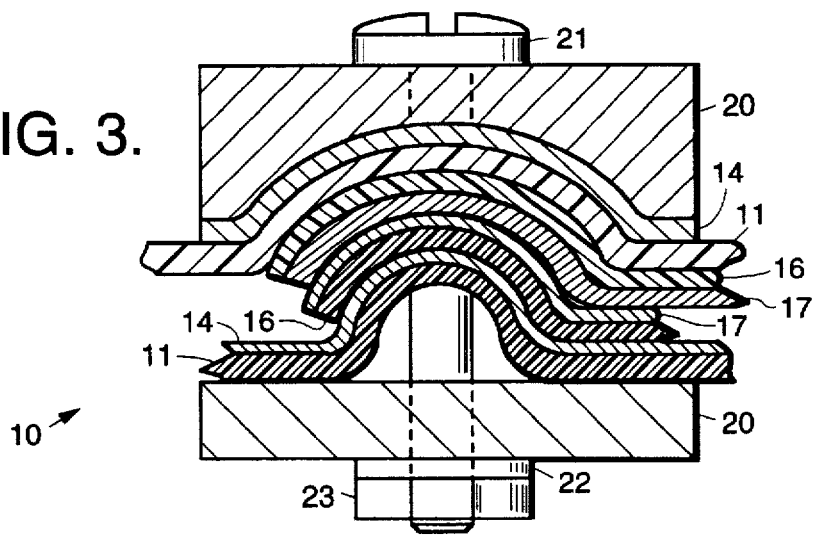
FIG. 3 illustrates a fully assembled dimpled connector in accordance with the principles of the present invention.

FIG. 3 illustrates a fully assembled dimpled connector 10 in accordance with the principles of the present invention. As is shown in FIG. 3, a lower structural substrate 11 supports a lower flexible interconnect circuit 12 having conductive traces 17 formed on its top surface. The contact area 19 is made to contact the corresponding contact area 19 of an upper flexible interconnect circuit 12 having conductive traces 17 formed on its bottom surface. The upper flexible interconnect circuit 12 is in turn supported by an upper structural substrate 11 having its metallization pattern 14 formed on it in the same manner as the lower structural substrate 11. The structural substrates 11 are pressed together so that the contact areas 19, and more specifically, the conductive traces 17, make contact with each other using the plates 20 or other securing members 20. The plates 20 or other securing members 20 may be fastened together using screws 21, washers 22 and nuts 23, for example.

Figure 4:
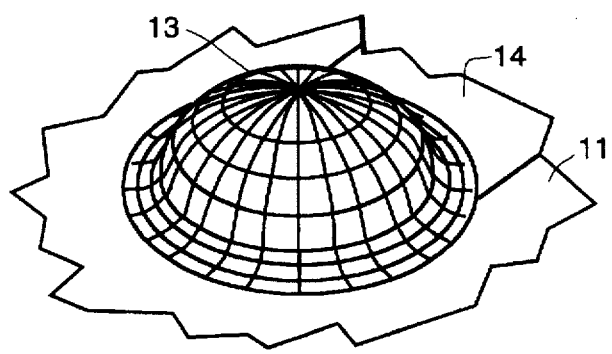
FIG. 4 shows a perspective view of a portion of a structural dimple of the dimpled connector of FIG. 2.

FIG. 4 shows a perspective view of a portion of the structural substrate 11 and structural dimple 13 of the dimpled connector 10 of FIG. 2. The domed shape of the structural dimple 13 formed in the structural substrate 11 is more clearly shown in FIG. 4.

Figure 5:
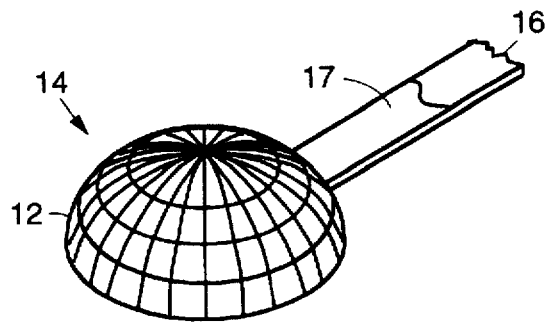
FIG. 5 shows a perspective view of a first embodiment of an interconnection dimple that may be used in the dimpled connector of FIG. 2.

The metallization pattern that forms the contact areas 19 on the flexible interconnect circuit 12 may have a variety of different configurations, some of which are shown in FIGS. 5–8. FIG. 5 shows a perspective view of a first embodiment illustrating the shape of the contact areas 19 that may be used in the dimpled connector 10 of FIG. 2. The contact area 19 of FIG. 5 have a domed shape to match the shape of the structural dimples 13.

Figure 6:
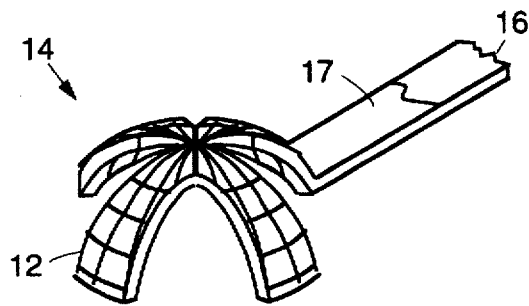
FIG. 6 shows a perspective view of a second embodiment of an interconnection dimple that may be used in the dimpled connector of FIG. 2.

FIG. 6 shows a perspective view of a second embodiment illustrating the shape of the contact area 19 that may be used in the dimpled connector 10 of FIG. 2. The contact area 19 of FIG. 6 are domed shaped with cutouts that flex relative to the structural dimples 13.

Figure 7:
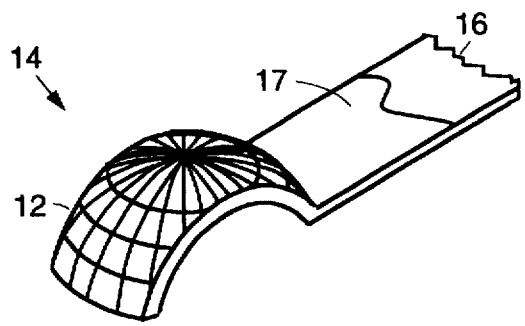
FIG. 7 shows a perspective view of a third embodiment of an interconnection dimple that may be used in the dimpled connector of FIG. 2.

FIG. 7 shows a perspective view of a third embodiment illustrating the shape of the contact area 19 that may be used in the dimpled connector 10 of FIG. 2. The contact area 19 of FIG. 7 are domed shaped and truncated to form relatively thin contact areas 19 that flex relative to the structural dimples 13.

Figure 8:
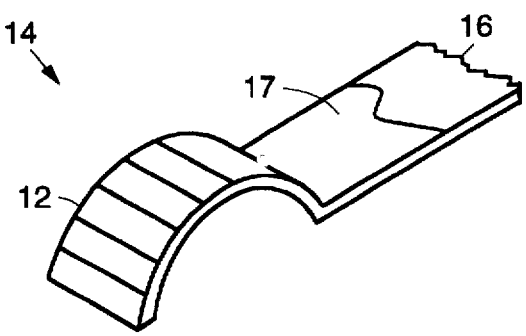
FIG. 8 shows a perspective view of a fourth embodiment of an interconnection dimple that may be used in the dimpled connector of FIG. 2.

FIG. 8 shows a perspective view of a fourth embodiment illustrating the shape of the contact area 19 that may be used in the dimpled connector 10 of FIG. 2. The contact areas 19 of FIG. 8 are cylindrically shaped and truncated to form relatively thin contact areas 19 that flex relative to the conductive structural dimples 13.

The dimpled connector 10 makes electrical interconnection possible without the use of a connector or soldered wire. The dimpled connector 10 may be readily used in high density and low profile connector applications. The dimpled connector 10 may be used to replace cable-wrap connectors, for example.

Advantages of the dimpled connector 10 include lower cost, smaller size, higher reliability, and less volume than conventional cable-wrap connectors, for example. Furthermore, the dimpled connector 10 may be easily replaced in the field for those systems that are found to have defective connectors, without requiring return of the systems to a factory or repair depot. The dimpled connector 10 may be used in military, commercial and industrial applications, such as on military aircraft and avionics, automotive products and display products, for example.

Thus, connectors employing a dimpled structural circuit and a double sided flexible interconnect circuit have been disclosed. It is to be understood that the described embodiments are merely illustrative of some of the many specific embodiments which represent applications of the principles of the present invention. Clearly, numerous and varied other arrangements may be readily devised by those skilled in the art without departing from the scope of the invention.

What is claimed is:

1. A connector comprising:

a first structural substrate comprising one or more mechanically raised structural dimples formed therein that protrude above a top surface thereof, and a first metallization pattern formed on the top surface of the first structural substrate which overlays each of the structural dimples;

a first flexible interconnect circuit that is matable with the first structural substrate that comprises a first dielectric substrate having conductive traces formed on a top side thereof that terminate at first contact areas, and wherein the first contact areas are configured to conform to an exterior surface of the dimples formed on the first structural substrate;

a second structural substrate comprising one or more mechanically raised structural dimples formed therein that protrude above a top surface thereof, and a second metallization pattern formed on the top surface of the second structural substrate which overlays each of the structural dimples;

a second flexible interconnect circuit that is matable with the second structural substrate that comprises a second dielectric substrate having second conductive traces formed on a bottom side thereof that terminate at second contact areas, and wherein the contact areas are configured to conform to an interior surface of the dimples formed on the second structural substrate;

and wherein the first and second flexible interconnect circuits are respectively supported by the first and second structural substrates and the first and second metallization patterns formed thereon and have their respective first and second contact areas disposed in contact with each other; and securing means for compressing the first and second structural substrates together to hold the contact areas together.

2. The connector of claim 1 wherein the metallization patterns formed on the structural substrates are comprised of beryllium copper.

3. The connector of claim 1 wherein the conductive traces are connected by vias through the dielectric substrate to a portion of the metallization pattern.

4. The connector of claim 3 wherein the portion of the metallization pattern comprises a ground plane.

5. The connector of claim 1 wherein the flexible interconnect circuit is a flat flexible circuit.

* * * * *